United States Patent

Catanach

[11] Patent Number: 5,557,273
[45] Date of Patent: Sep. 17, 1996

[54] MAGNETIC AZIMUTH DETECTOR TO DIGITAL (MAD) CONVERTER

[75] Inventor: Steven J. Catanach, Rio Rancho, N.M.

[73] Assignee: Honeywell Inc., Minneapolis, Minn.

[21] Appl. No.: 23,026

[22] Filed: Feb. 25, 1993

[51] Int. Cl.[6] ..................................... H03M 1/48
[52] U.S. Cl. ............................. 341/116; 341/112
[58] Field of Search .................... 341/116, 117, 341/112, 111

[56] References Cited

U.S. PATENT DOCUMENTS

| | | | |
|---|---|---|---|
| 3,618,073 | 11/1971 | Domchick et al. | 341/116 |
| 3,735,391 | 5/1973 | Games et al. | 341/116 |
| 3,868,680 | 2/1975 | Rhodes | 341/116 |
| 4,062,005 | 12/1977 | Freed et al. | 341/116 |
| 4,119,958 | 10/1978 | Simon et al. | 341/116 X |
| 4,270,077 | 5/1981 | Swartz et al. | 341/116 X |
| 4,338,810 | 7/1982 | Gollomp . | |
| 4,340,881 | 7/1982 | Stack et al. | 341/116 X |
| 4,978,900 | 12/1990 | Skawinski | 341/116 |
| 5,034,743 | 7/1991 | Deppe et al. | 341/116 |
| 5,134,397 | 7/1992 | Eyerly et al. | 341/116 |
| 5,162,798 | 11/1992 | Yundt | 341/116 |

Primary Examiner—Marc S. Hoff
Attorney, Agent, or Firm—John P. Sumner; Kenneth J. Johnson

[57] ABSTRACT

An electrical system for converting a magnetic azimuth detector (MAD) signal into a corresponding digital signal. A conversion circuit receives a three-wire signal from the MAD; the three-wire signal is proportional to an angle θ, which indicates the position of the MAD relative to magnetic north. The conversion circuit converts the three-wire signal into sin θ and cos θ signals. A digitization circuit converts the sin θ and cos θ signals into corresponding digital signals by first half-wave demodulating the analog sin θ and cos θ signals, then low-pass filtering the signals to extract the DC components, and finally digitizing the analog DC components.

8 Claims, 13 Drawing Sheets

MAGNETIC AZIMUTH DETECTOR TO DIGITAL (MAD) CONVERTER

The Government has rights in this invention pursuant to Contract No. F34601-88-C-0255, awarded by the Department of the Air Force.

FIELD OF THE INVENTION

The present invention relates to a system for converting signals from a magnetic azimuth detector into corresponding digital signals.

BACKGROUND OF THE INVENTION

FIG. 1 is a schematic diagram of a prior art closed loop electro-mechanical servo system that converts signals from a magnetic azimuth detector 14 (MAD) into the corresponding digital signals 15. This electro-mechanical system essentially converts three-wire data representing analog electrical angles from a flux valve (MAD) to an equivalent mechanical shaft angle and then generates a digital representation of the mechanical angle.

The electro-mechanical servo system comprises a synchro control transformer 10 (CT) that accepts, at its three-wire stator terminals, a set of carrier frequency signals (nominally 800 Hz) from the flux valve 14 excited by a 400 Hz reference. The CT 10 produces, at its rotor terminals, a carrier frequency signal proportional to the sine of the angular difference $(\sin(\theta-\phi))$ between the electrical input angle, $\theta$, and the mechanical angular position of the CT shaft, $\phi$. Since the flux valve signals are distorted by the harmonics of the reference and fundamental frequencies, the CT 10 is "tuned" by capacitors on its rotor terminals.

The capacitors create a bandpass filter with a maximum amplitude response at the frequency of interest as the circuit is at or near the resonant condition. This filtered signal is then processed to control a motor 11, which drives the shaft of the CT 10, and the shaft of a synchro control transmitter 12 (CX) until $\sin(\theta-\phi)$ goes to zero, indicating the mechanical angle equals the electrical angle.

The shafts of the CT 10 and CX 12 are connected to the motor 11 by a mechanical linkage such that their reference shaft positions are the same. The CX 12 accepts an AC reference excitation at its rotor terminals and develops at its stator terminals a three-wire AC output at the reference frequency. The amplitude ratios of the line-to-line voltages of this three-wire output are a function of the angular position of the shaft. These signals are supplied to the synchro-to-digital converter 13 (S/D) which produces a digital representation of the electrical angle $\theta$ for use by the processor.

The servo mechanism shown in FIG. 1 is susceptible to failure due to repeated use and resulting degradation of the mechanical components. A need exists, therefore, for a purely electrical MAD converter system which eliminates the mechanical components and thus has an increased reliability.

SUMMARY OF THE INVENTION

This invention is an electrical system for converting signals from a magnetic azimuth detector into corresponding digital signals. A conversion circuit receives a three-wire signal from the MAD. This three-wire signal is proportional to an angle $\theta$, which indicates the MAD's position relative to magnetic north. The conversion circuit converts the three-wire signal into signals proportional to the sin $\theta$ and cos $\theta$.

A demodulator and filter circuit extract the DC components from the sine and cosine signals. Finally, an analog-to-digital converter produces the corresponding digital representations of the DC components. These digital signals are thus proportional to the sin $\theta$ and cos $\theta$. A processor may use this invention to receive the digital signals and calculate the angle $\theta=\arctan(\sin \theta/ \cos \theta)$.

DETAILED DESCRIPTION OF THE PREFERRED EMBODIMENT

In the following detailed description of the preferred embodiment, reference is made to the accompanying drawings which form a part hereof and in which is shown by way of illustration a specific embodiment in which the invention may be practiced. This embodiment is described in sufficient detail to enable those skilled in the art to practice the invention, and it is to be understood that other embodiments may be utilized and that structural or logical changes may be made without departing from the scope of the present invention. The following detailed description is, therefore, not to be taken in a limiting sense, and the scope of the present invention is defined by the appended claims.

CONCEPTUAL OPERATION

Figure 1:
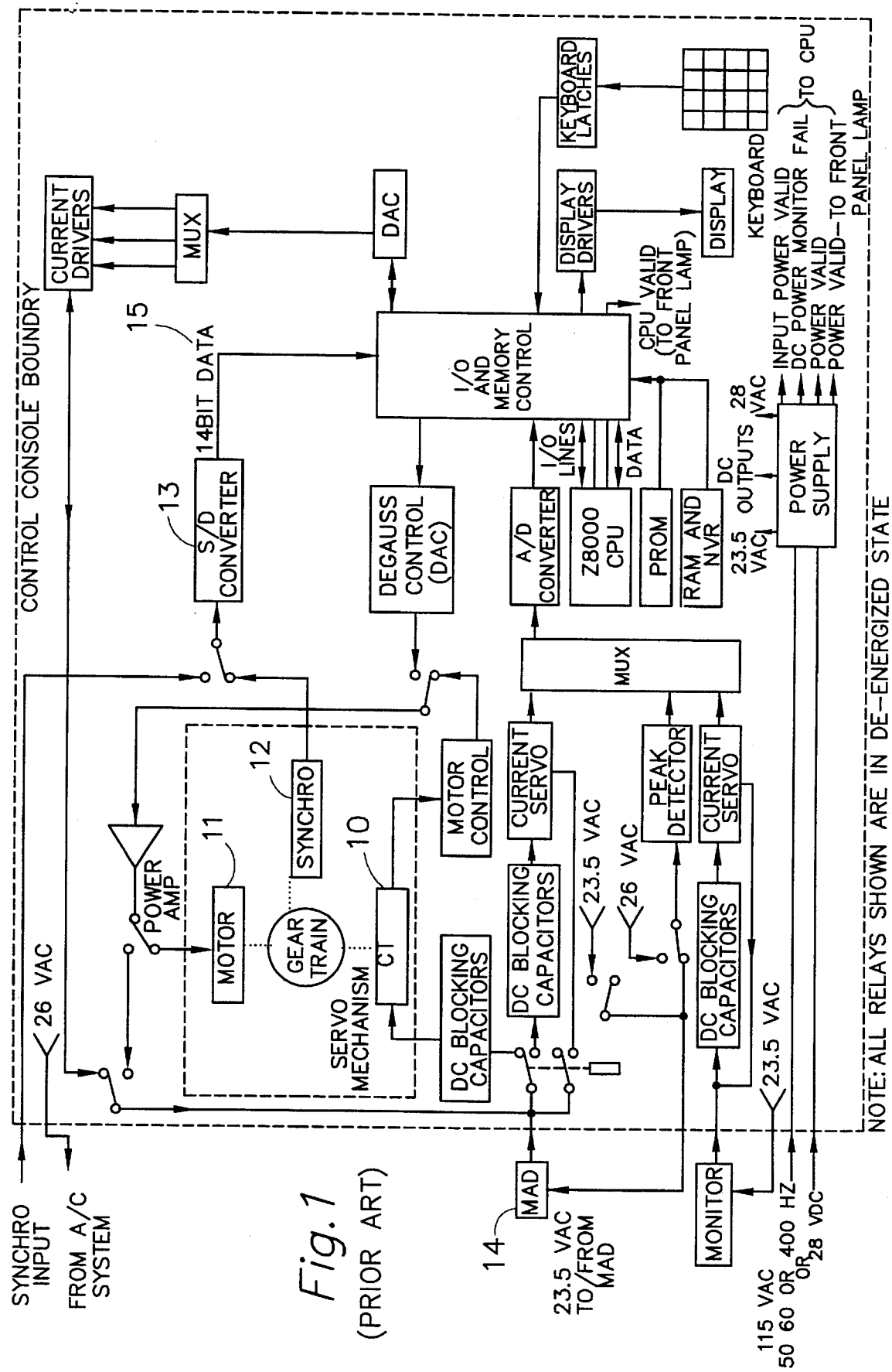
FIG. 1 is a schematic diagram of a prior art electro-mechanical servo system operating on signals from a magnetic azimuth detector.
Figure 2:
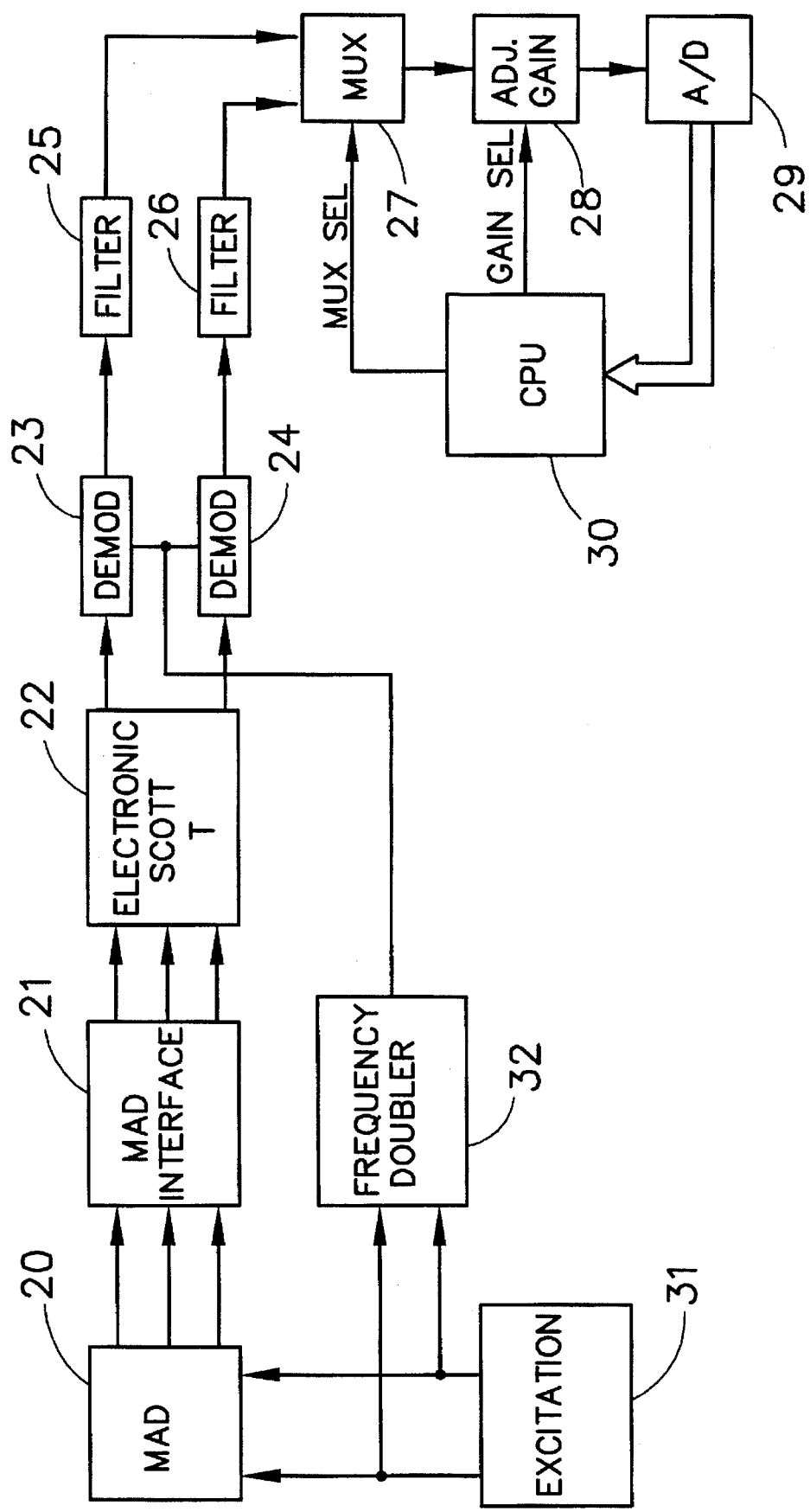
FIG. 2 is a preferred block diagram of the MADD converter.

FIG. 2 is a general preferred block diagram of the MADD converter. An excitation source 31 provides an oscillating signal to MAD 20 (also referred to as a flux valve) for use in generating a three-wire signal from the MAD. A MAD interface 21 receives the three-wire signal and provides AC buffering. The signals generated by flux valve 20 are defined in equations [1]–[3].

$$V_{ALEG}=[KH_e V_{MAX}\cos\theta][\sin(2\pi ft)]+(\text{Relative Harmonics}) \quad [1]$$

$$V_{BLEG}=[KH_e V_{MAX} \cos(\theta+120)][\sin(2\pi ft)]+(\text{Relative Harmonics}) \quad [2]$$

$$V_{CLEG}=[KH_e V_{MAX} \cos(\theta+240)][\sin(2\pi ft)]+(\text{Relative Harmonics}) \quad [3]$$

In equations [1]–[3]: $H_e$=Earth's magnetic field; K=Constant relating earths magnetic field to voltage; f=Fundamental frequency; and $\theta$=Angle of earth's magnetic field.

An electronic Scott-T 22 (EST) converts the buffered three-wire signal, defined in equations [1]–[3], into corresponding sine and cosine signals, as defined in equations [4] and [5].

$$V_{COS} = n[KH_e V_{MAX} \cos \theta \ [\text{SIN} \ (2\pi f t)] + (\textit{Relative Harmonics})] \quad [4]$$

$$V_{SIN} = n[KH_e V_{MAX} \sin \theta \ [\text{SIN} \ (2\pi f t)] + (\textit{Relative Harmonics})] \quad [5]$$

In equations [4] and [5], n=Gain of the electronic Scott-T.

Demodulators 23 and 24 perform half-wave demodulation of the sine and cosine signals at twice the excitation frequency. A frequency doubler 32 provides the oscillating signal for use in the demodulation. The half-wave demodulation effectively eliminates the even frequency components of the sine and cosine signals. The flux valve signal may be defined as shown in equation [6].

$$f(t) = \sum_{m=1}^{\infty} A_m \sin(mwt + \theta_m) \quad [6]$$

In equation [6], $A_m$ represents the amplitude of the respective components of the flux valve signal, i.e., $A_1$=amplitude at 400 Hz, $A_2$=amplitude at 800 Hz; and $\theta_m$ is the phase shift; for each harmonic. For simplicity, it is assumed that the harmonics are in phase (common zero crossing point at a given time for the respective frequencies), meaning that $\theta_m$ is zero and the DC component of each harmonic is at a maximum.

The flux valve signal, as defined in equation [6], may be half-wave demodulated at twice the excitation frequency over one full cycle of the lowest frequency component present (excitation frequency) in order to obtain a true representation of the signals within this envelope. Equations [7]–[10] define the demodulated flux valve signal.

$$f(t) = \sum_{m=1}^{\infty} A_m \sin(mwt + \theta_m) \quad 0 < t < T/4 \quad [7]$$

$$f(t) = 0 \quad T/4 < t < T/2 \quad [8]$$

$$f(t) = \sum_{m=1}^{\infty} A_m \sin(mwt + \theta_m) \quad T/2 < t < 3T/4 \quad [9]$$

$$f(t) = 0 \quad 3T/4 < t < T \quad [10]$$

In equations [7]–[10], f(t) may be represented by the Fourier series as defined in equation [11].

$$f(t) = \frac{a_0}{2} + \sum_{n=1}^{\infty} a_n \cos(nwt) + \sum_{n=1}^{\infty} b_n \sin(nwt). \quad [11]$$

Solving equation [11] for $a_n$ and $b_n$ results in equations [12] and [13].

$$a_n = -\frac{a_0}{2\pi} \left\{ \frac{\cos(m+n)\pi[2\cos(m+n)\pi/2 - 1] - 1}{(m+n)} + \frac{\cos(m-n)\pi[2\cos(m-n)\pi/2 - 1] - 1}{(m-n)} \right\} \quad [12]$$

$$b_n = 0. \quad [13]$$

Filters 25 and 26 receive the demodulated sine and cosine signals and preferably provide a high degree of low pass filtering in order to effectively removes all but the DC component of the Fourier series ($a_0/2$ term). With n=0, the DC component is defined in equation [14].

$$a_0 = -\frac{A_m}{\pi m} \cos m\pi [2\cos m\pi/2 - 1] - 1 \quad [14]$$

Table 1 shows the DC component for eighteen samples of the fourier series representation of the flux valve signal as defined in equation [14].

TABLE 1

DC Component of Fourier Series

| m  | Nominal frequency | $a_0/2$      |
|----|-------------------|--------------|
| 1  | 400               | 0            |
| 2  | 800               | $A_2/\pi$    |
| 3  | 1200              | 0            |
| 4  | 1600              | 0            |
| 5  | 2000              | 0            |
| 6  | 2400              | $A_6/3\pi$   |
| 7  | 2800              | 0            |
| 8  | 3200              | 0            |
| 9  | 3600              | 0            |
| 10 | 4000              | $A_{10}/5\pi$|
| 11 | 4400              | 0            |
| 12 | 4800              | 0            |
| 13 | 5200              | 0            |
| 14 | 5600              | $A_{14}/7\pi$|
| 15 | 6000              | 0            |
| 16 | 6400              | 0            |
| 17 | 6800              | 0            |
| 18 | 7200              | $A_{18}/9\pi$|

A multiplexer 27, controlled by processor 30, alternately switches between its two inputs in order to alternately transmit the DC components to gain stage 28. The processor 30 also controls the gain stage 28 to amplify the DC components of the sine and cosine signals. Finally, analog-to-digital converter 29 converts the analog DC components into the corresponding digital signals. The processor 30 receives these digital signals, which correspond proportionally to the sine and cosine signals.

CIRCUIT IMPLEMENTATION

FIGS. 3–13 are a preferred schematic diagram for circuitry that implements the MADD system. This schematic diagram is only one example of circuitry for implementing the MADD system. In the schematic diagram of FIGS. 3–13, capacitor values are in microfarads and resistor values are in Ohms.

Figure 3:
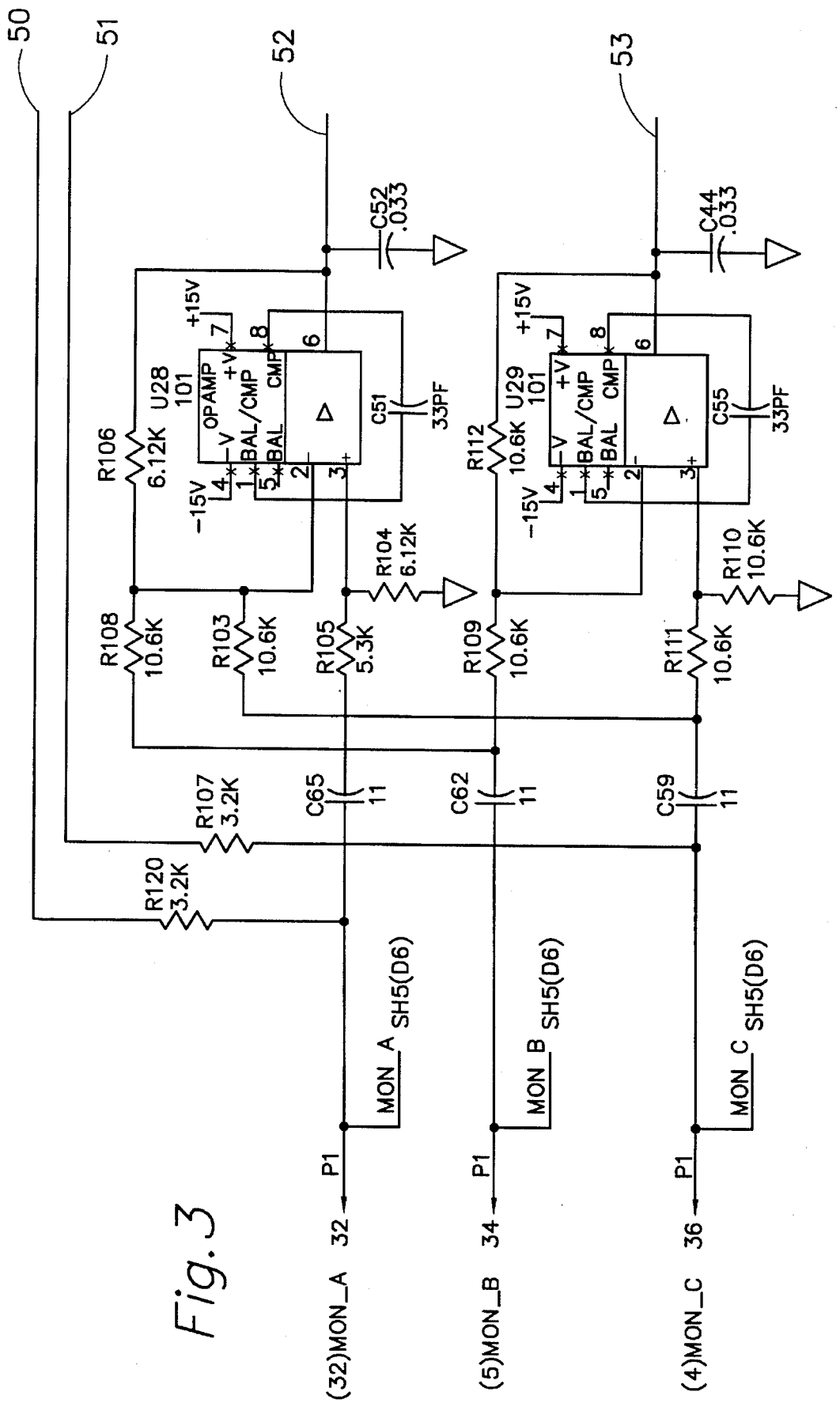
FIGS. 3–4 are a preferred schematic diagram for a MON current servo interface circuit.
Figure 4:
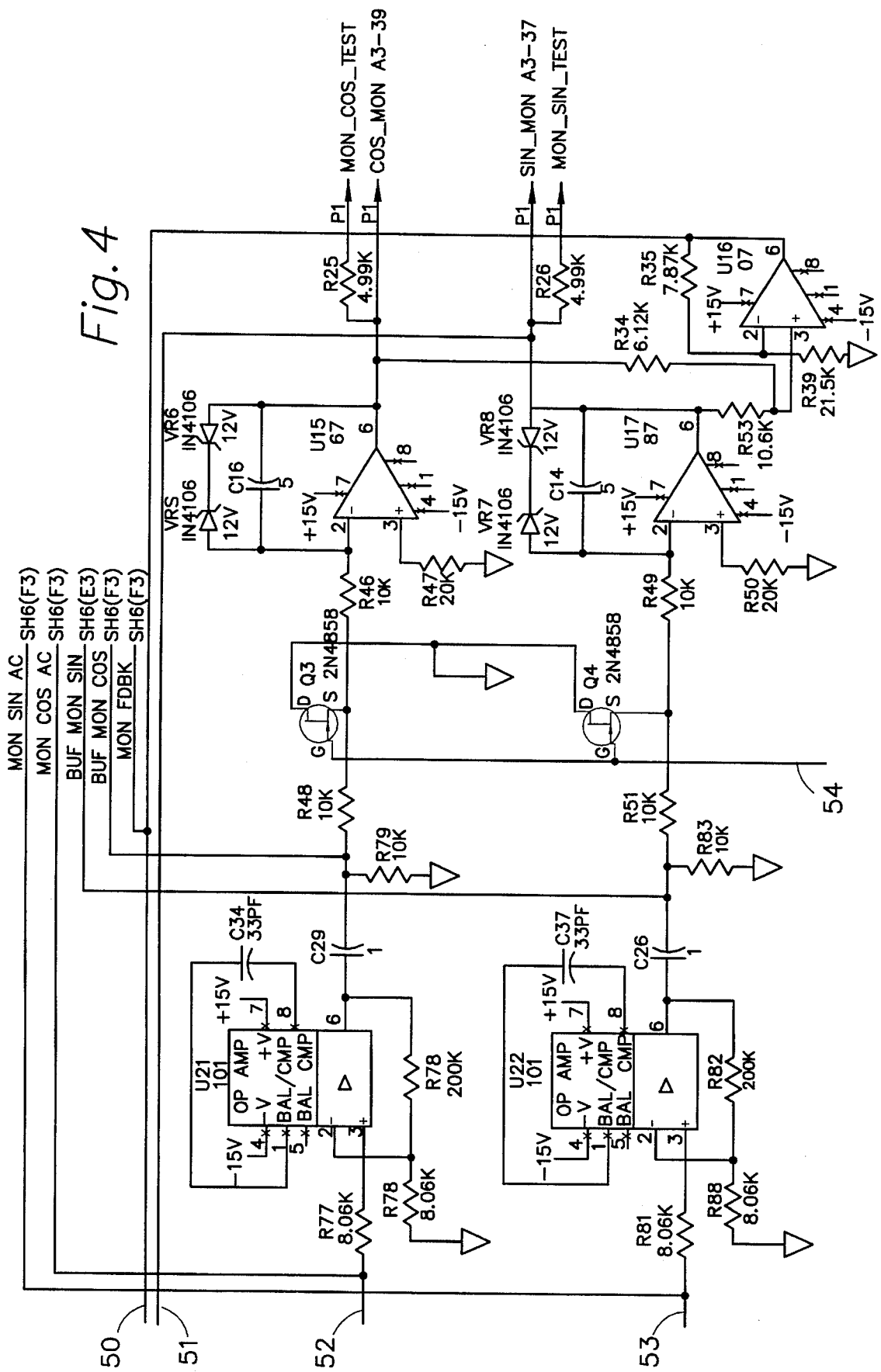
Figure 5:
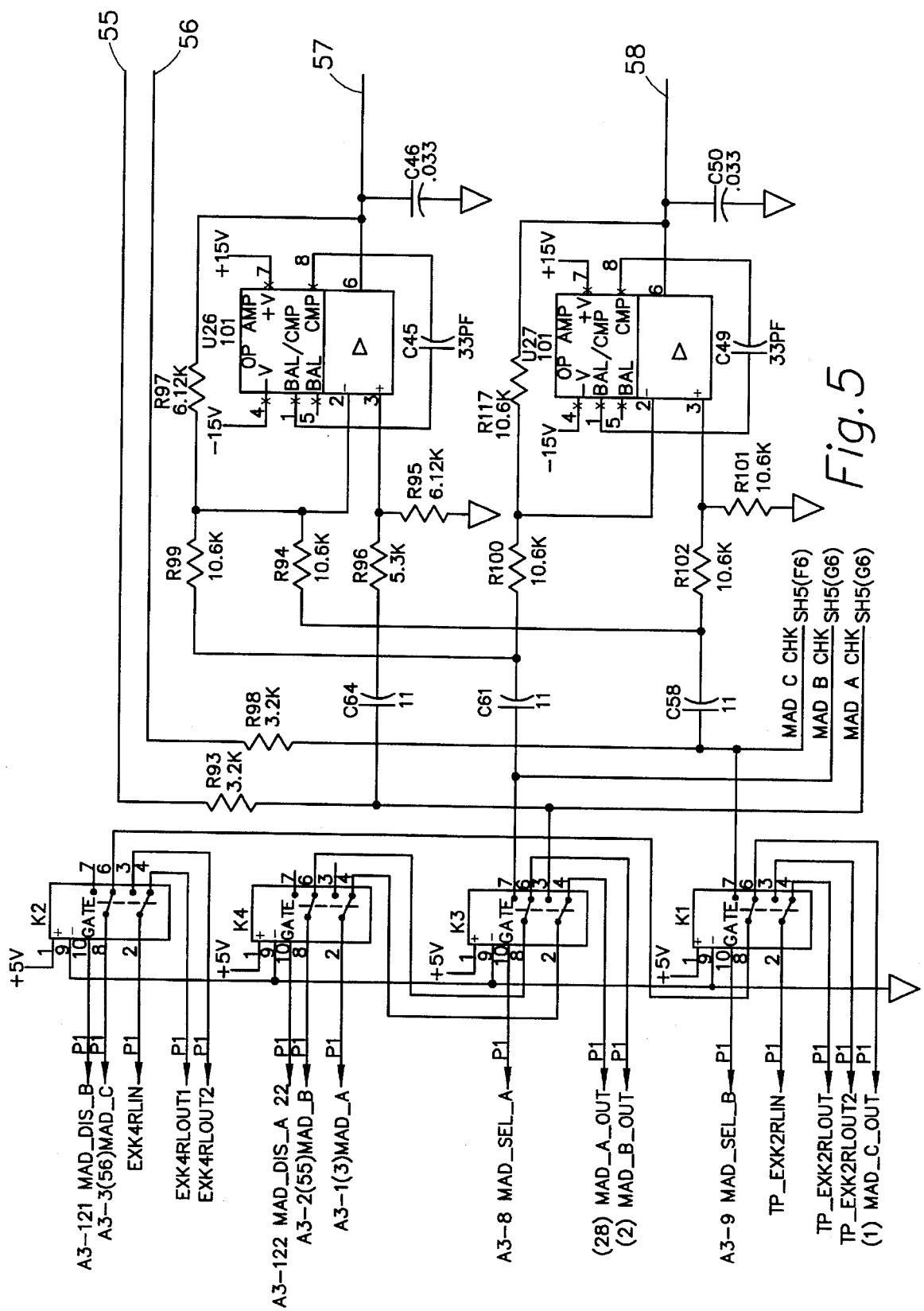
FIGS. 5–6 are a preferred schematic diagram for a MAD current servo interface circuit.
Figure 6:
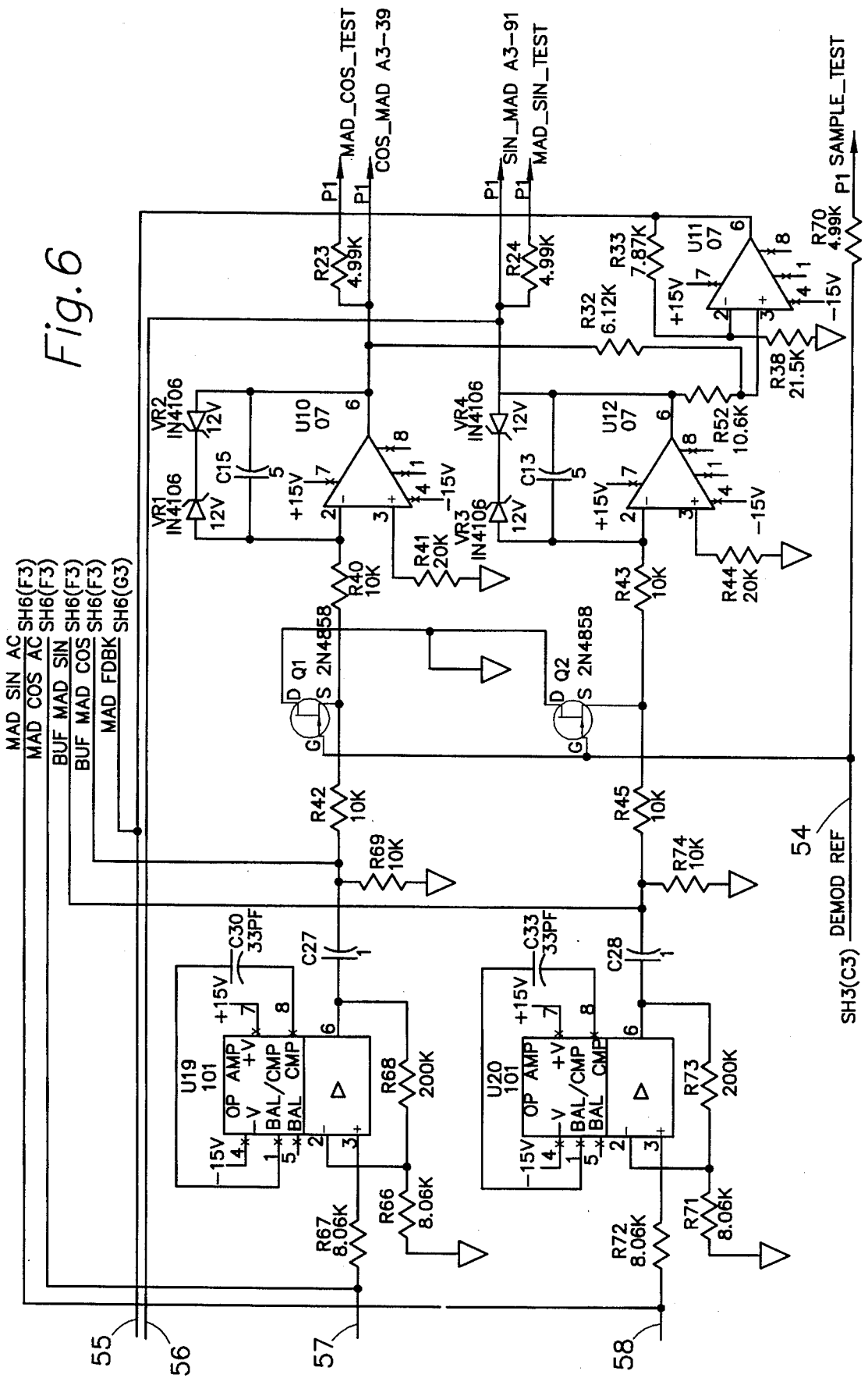

FIGS. 3–4 are a preferred schematic diagram for a MON current servo interface circuit. FIGS. 5–6 are a preferred schematic diagram for a MAD current servo interface circuit. These circuits interface the flux valve 20 with the electronic Scott-T 22 and are represented by MAD interface 21 in FIG. 2. The type of compass system within which the MADD operates may influence the requirements of an interface circuit. Therefore, each of these two interface circuits of FIGS. 3–6 have different loading and output characteristics in order for the MADD to operate in different types of compass systems.

Figure 7:
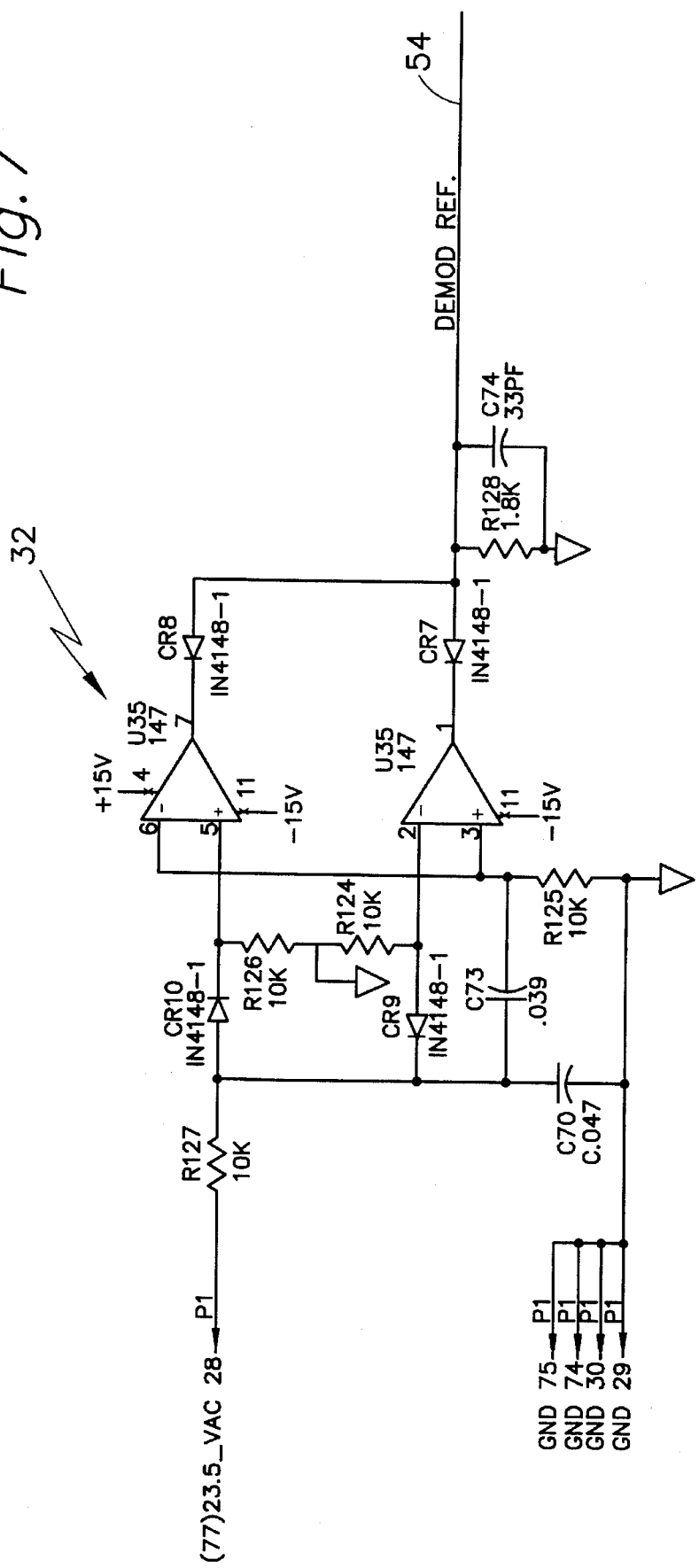
FIG. 7 is a preferred schematic diagram for a frequency doubler circuit.

FIG. 7 is a preferred schematic diagram for the frequency doubler circuit 32. This circuit receives an oscillating signal from the excitation source 31, which in the embodiment shown is at a frequency of 400 Hz. The MADD may also operate with other excitation frequencies. The excitation source 31 also provides the 400 Hz oscillating signal to the flux valve 20, which causes the flux valve to produce output signals at 800 Hz (twice the excitation frequency). The frequency doubler 32 provides a reference oscillating signal to the demodulators 23 and 24 at twice the excitation frequency in order to match the frequency of the flux valve output signals for demodulation.

Figure 8:
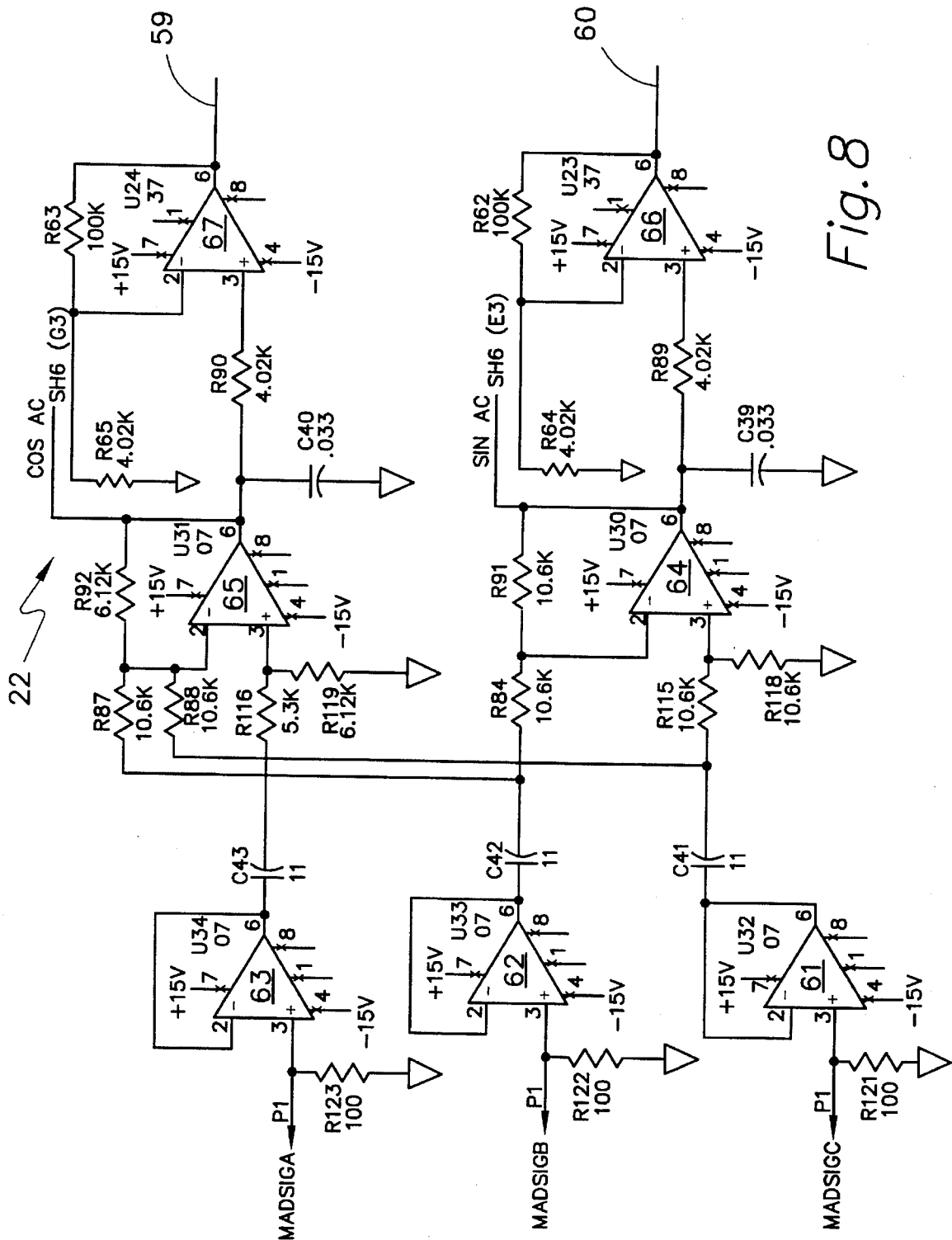
FIGS. 8–9 are a preferred schematic diagram for a conversion and demodulation circuit.

FIG. 8 is a preferred schematic diagram for the electronic Scott-T 22. Three unity gain buffers 61–63 receive the three-wire signal from the flux valve. Two adder circuits 64 and 65 receive the buffered three-wire signal and convert it to a two-wire signal, proportional to the sin θ and cos θ as defined above. This two-wire signal is preferably buffered by amplifiers 66 and 67 before being transmitted to the demodulation stage.

Figure 9:
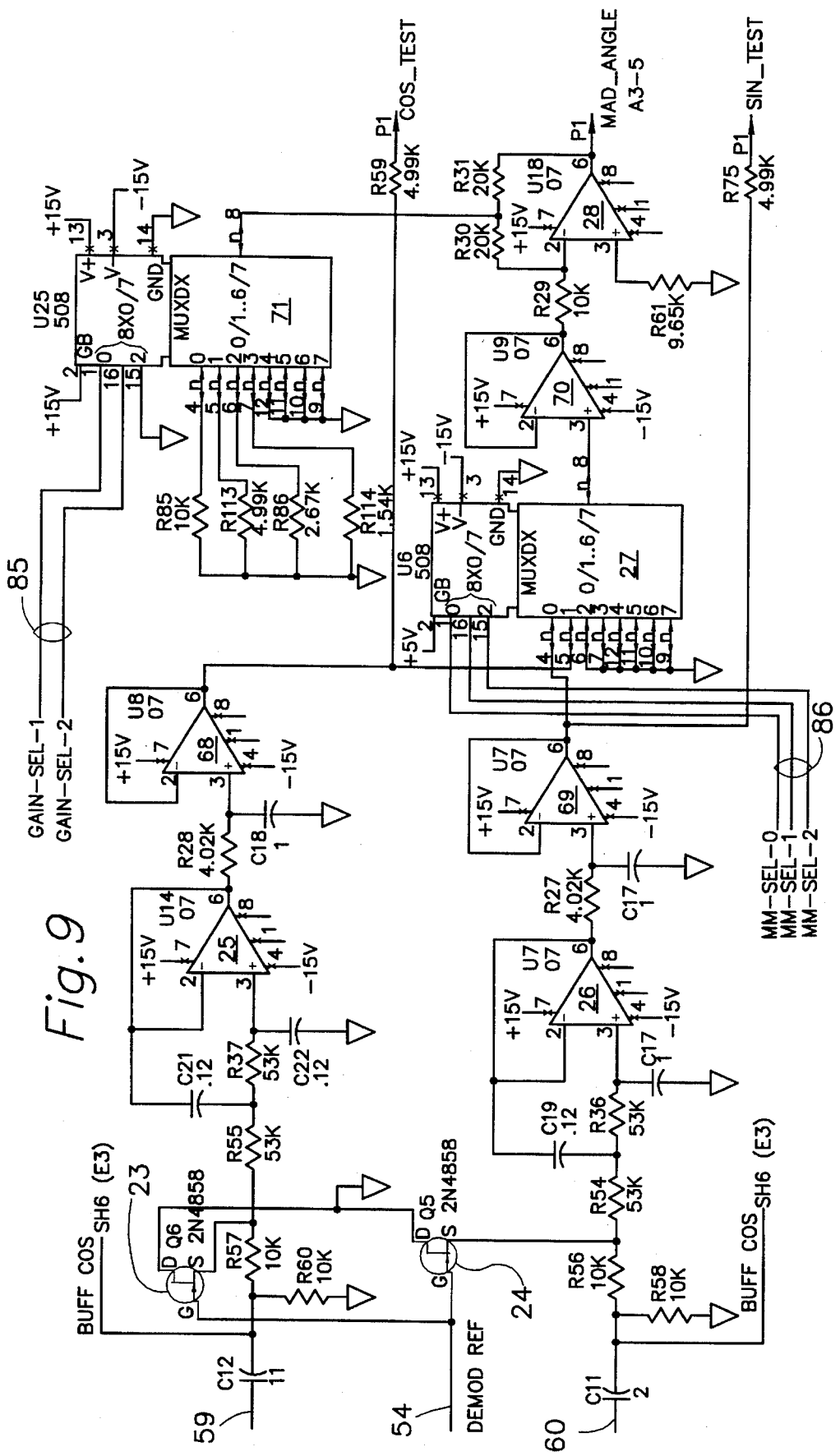

FIG. 9 is a preferred schematic diagram for the demodulators 23 and 24, filters 25 and 26, multiplexer 27, and gain stage 28. The demodulators 23 and 24 receive the two-wire sine and cosine signal on lines 59 and 60, and also receive the demodulator reference signal on line 54 from the frequency doubler. As shown in FIG. 9, the demodulators 23 and 24 are typically implemented with FET's, which function as multipliers and use the demodulator reference signal at 800 Hz in order to recover the baseband signal from the two-wire signal, which is also modulated at 800 Hz.

The filters 25 and 26 are low pass filters, which function to remove the high frequency components from the demodulated two-wire sine and cosine signals. Unity gain buffers 68 and 69 transmit the baseband (DC component) sine and cosine signals to multiplexer 27. The multiplexer 27 preferably operates to alternately switch back and forth between the sine and cosine signal inputs. Unity gain buffer 70 transmits the output of multiplexer 27 to gain stage 28. Another multiplexer 71 may be used to provide various control signals in order to set gain stage 28 at a particular level of amplification. The processor 30 would typically provide the control signals for the multiplexers 27 and 71.

Figure 10:
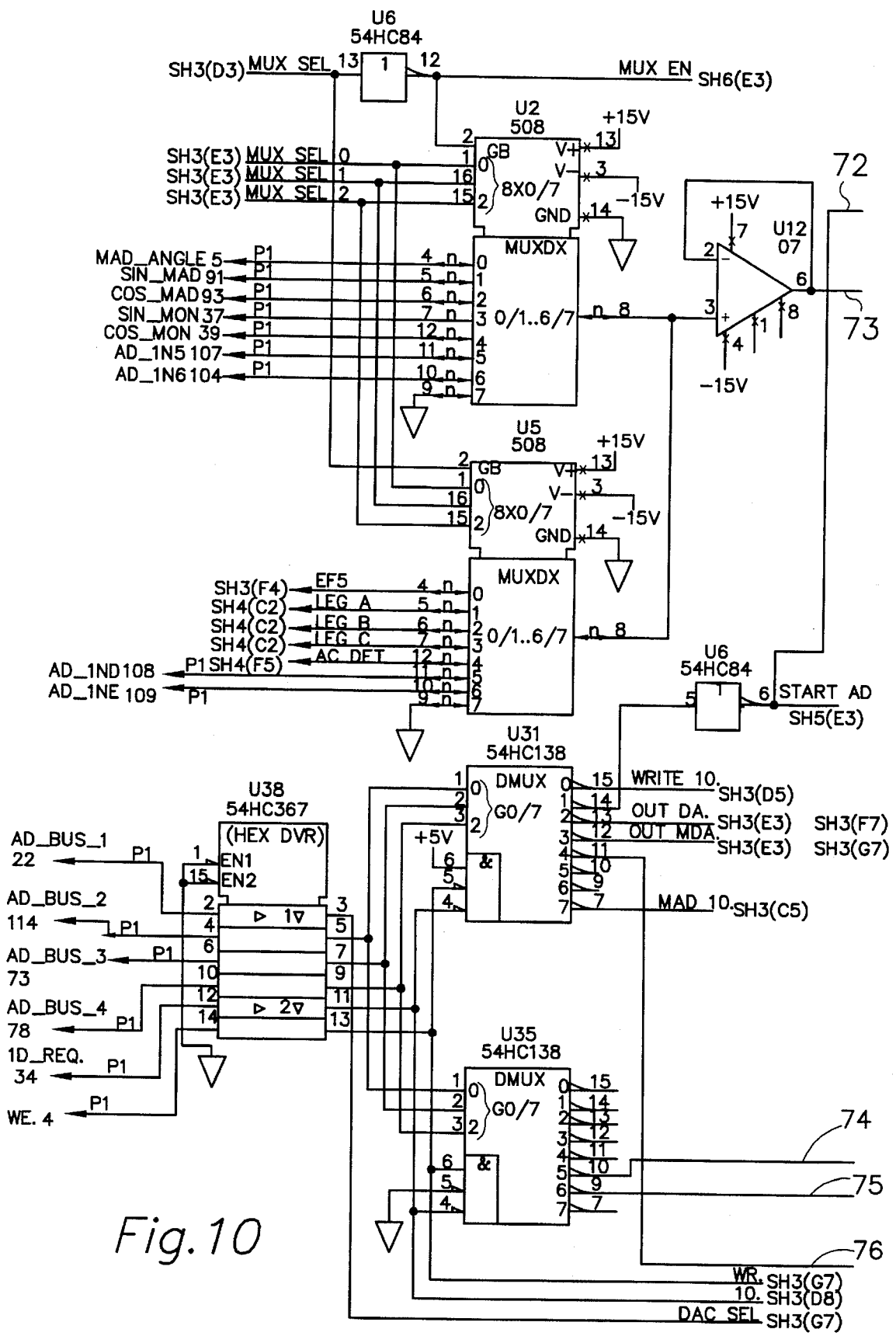
FIGS. 10–11 are a preferred schematic diagram for an analog-to-digital conversion circuit.
Figure 11:
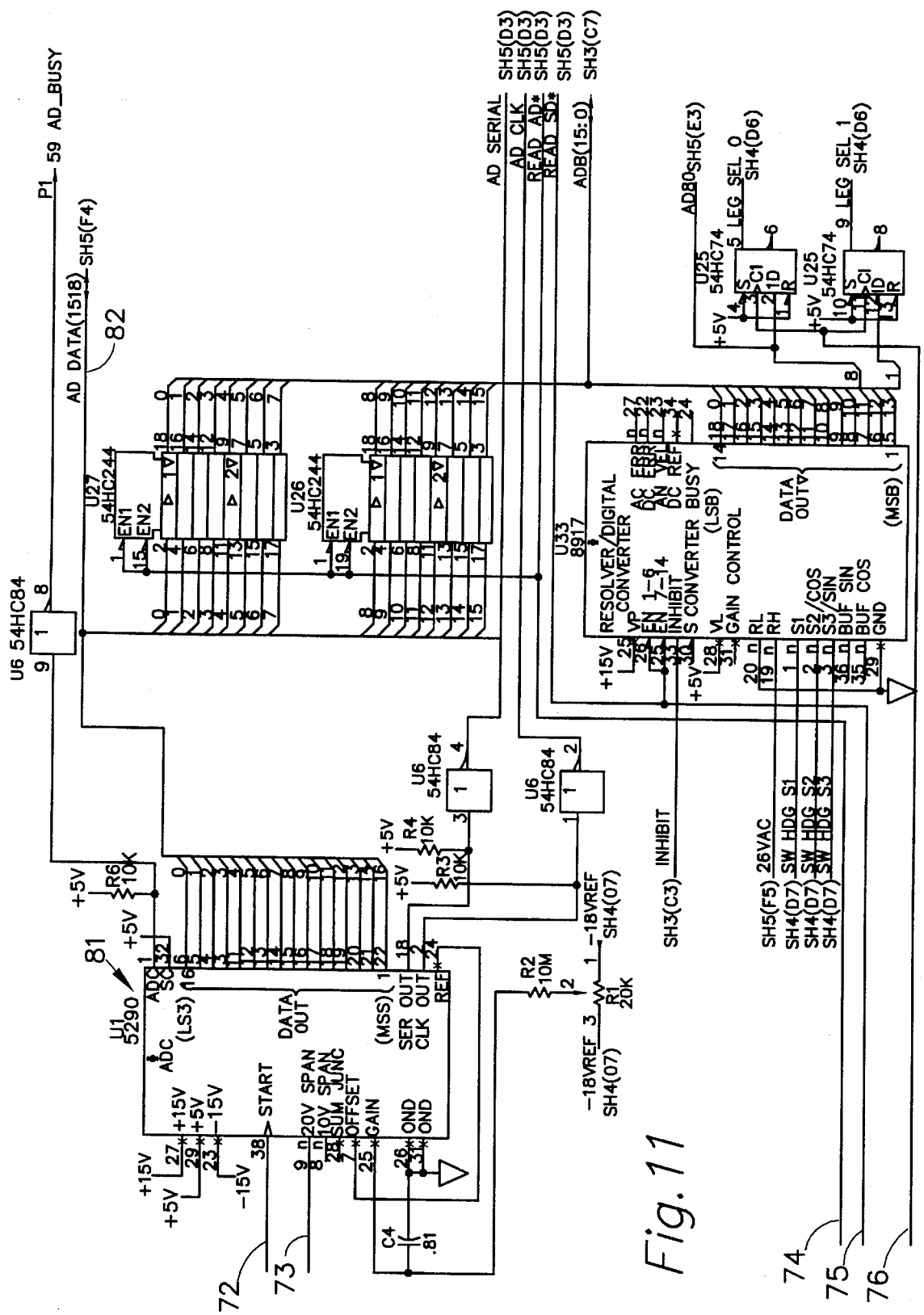

FIGS. 10–11 are a preferred schematic diagram for the analog-to-digital conversion circuit. This circuit receives the sine and cosine signals and converts them into the corresponding digital signals via analog-to-digital converter 81. The digital data is output on line 82 for transmission to the processor.

Figure 12:
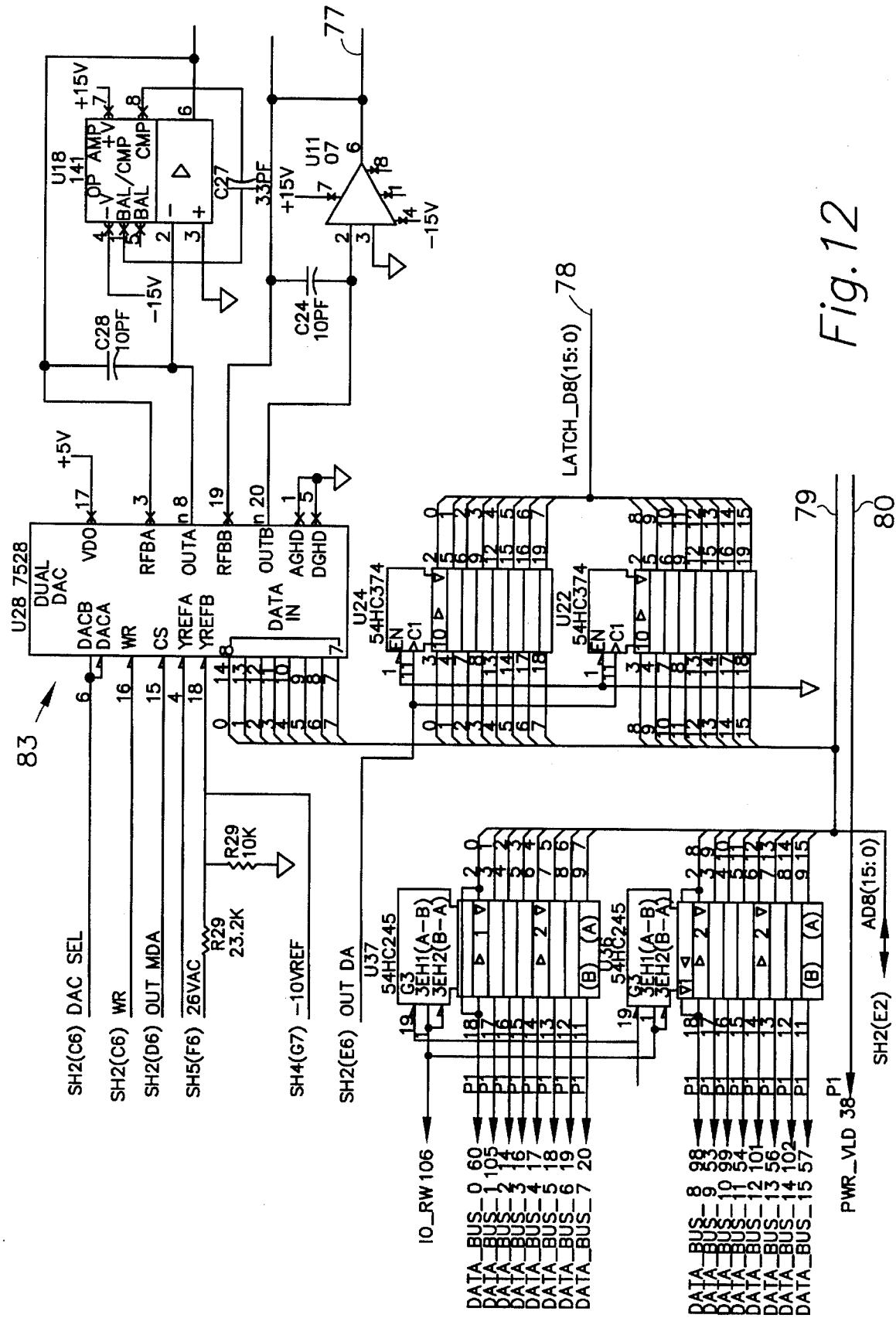
FIGS. 12–13 are a preferred schematic diagram for circuitry that provides control signals generated by the processor.
Figure 13:
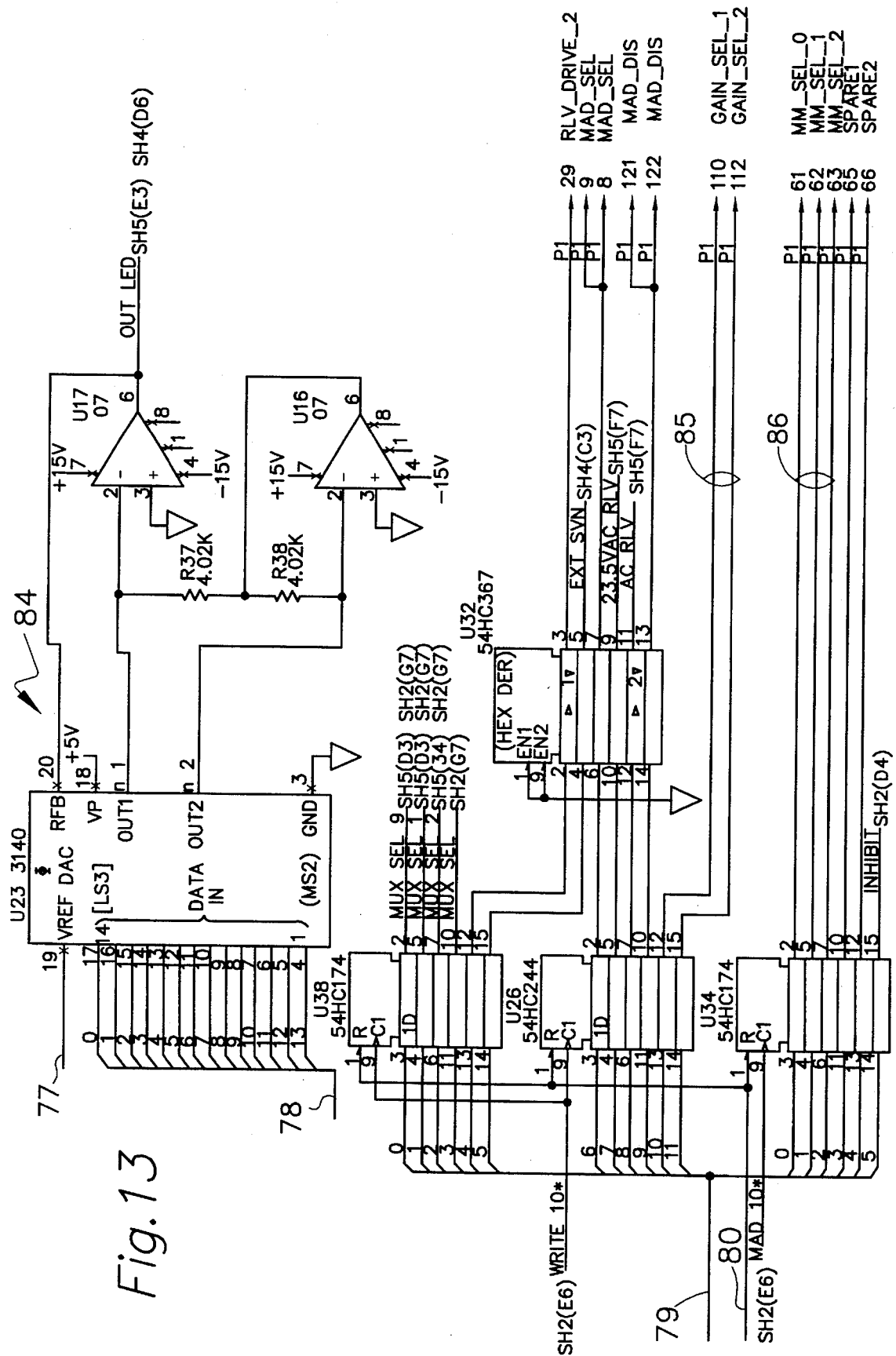

FIGS. 12–13 are a preferred schematic diagram for the circuitry that provides control signals generated by the processor. The processor provides digital control signals, which may be converted into the corresponding analog control signals by dual digital-to-analog converters 83 and 84. The digital control signals may also include: control signals 85, which control the gain stage 28; and control signals 86, which control multiplexer 27 (FIG. 9).

While the present invention has been described in connection with the preferred embodiment thereof, it will be understood that many modifications will be readily apparent to those skilled in the art, and this application is intended to cover any adaptations or variations thereof. For example, different circuit components for implementing the functions identified in the block diagram may be used without departing from the scope of the invention.

It is manifestly intended that this invention be limited only by the claims and equivalents thereof.

What is claimed is:

1. A magnetic azimuth detector to digital converter circuit, comprising:

receive means for receiving a three-wire signal from a magnetic azimuth detector, wherein the three-wire signal is proportional to an angle q which indicates a position of the magnetic azimuth detector relative to magnetic north;

conversion means for electronically converting the three-wire signal into a first analog signal proportional to sin q and a second analog signal proportional to cos q comprising:

a first adder having a non-inverting input coupled to receive a first component of the three-wire signal, an inverting input coupled to receive a second component of the three-wire signal, and means for outputting the first analog signal: and a second adder having a non-inverting input coupled to receive a third component of the three-wire signal, an inverting input coupled to receive the second component of the three-wire signal, and means for outputting the second analog signal; and digitization means for electronically converting the first analog signal and the second analog signal into corresponding first and second digital signals.

2. The circuit of claim 1 wherein the digitization means comprises:

first demodulation means for half-wave demodulating the first signal;

first filter means for extracting a DC component from the first demodulated signal;

second demodulation means for half-wave demodulating the second signal; and second filter means for extracting a DC component from the second demodulated signal.

3. The circuit of claim 2 wherein the digitization means further comprises:

a multiplexer having a first input coupled to receive the first demodulated signal, a second input coupled to receive the second demodulated input, an output, and a control input;

an analog-to-digital converter having an input coupled to the multiplexer output, and an output; and processor means coupled to the multiplexer control input and the analog-to-digital converter output, for controlling the multiplexer to alternately switch between the first input and the second input, and for receiving the corresponding digitized signals from the analog-to-digital converter.

4. The circuit of claim 3 wherein the digitization means further comprises amplification means, coupled between the multiplexer and the analog-to-digital converter, for amplifying a signal at the multiplexer output, wherein the processor means controls a level of amplification generated by the amplification means.

5. The circuit of claim 3 wherein the digitization means further comprises:

oscillator means, coupled to the magnetic azimuth detector, for providing a first constant oscillating signal to the magnetic azimuth detector; and frequency doubler means, coupled to receive the first oscillating signal, for providing to the first demodulator and the second demodulator a second oscillating signal at twice the frequency of the first oscillating signal.

6. A magnetic azimuth detector to digital converter circuit, comprising:

receive means for receiving a three-wire signal from a magnetic azimuth detector, wherein the three-wire signal is proportional to an angle q which indicates a position of the magnetic azimuth detector relative to magnetic north;

conversion means for electronically converting the three-wire signal into a first analog signal proportional to sin q and a second analog signal proportional to cos q; and digitization means for electronically converting the first analog signal and the second analog signal into corresponding first and second digital signals comprising:

first demodulation means for half-wave demodulating the first analog signal;

first filter means for extracting a DC component from the first demodulated signal;

second demodulation means for half-wave demodulating the second signal;

second filter means for extracting a DC component from the second demodulated signal;

a multiplexer having a first input coupled to receive the first demodulated signal, a second input coupled to receive the second demodulated input, an output, and a control input;

an analog-to-digital converter having an input coupled to the multiplexer output, and an output;

processor means coupled to the multiplexer control input and the analog-to-digital converter output, for controlling the multiplexer to alternately switch between the first input and the second input, and for receiving the corresponding digitized signals from the analog-to-digital converter; and amplification means coupled between the multiplexer and the analog-to-digital converter, for amplifying a signal at the multiplexer output, wherein the processor means controls a level of amplification generated by the amplification means.

7. The circuit of claim 6 wherein the conversion means comprises:

a first adder having a non-inverting input coupled to receive a first component of the three-wire signal, an inverting input coupled to receive a second component and a third component of the three-wire signal, and an output coupled to the digitization means; and a second adder having a non-inverting input coupled to receive the third component of the three-wire signal, an inverting input coupled to receive the second components of the three-wire signal, and an output coupled to the digitization means.

8. The circuit of claim 6 wherein the digitization means further comprises:

oscillator means, coupled to the magnetic azimuth detector, for providing a first constant oscillating signal to the magnetic azimuth detector; and frequency doubler means, coupled to receive the first oscillating signal, for providing to the first demodulator and the second demodulator a second oscillating signal at twice the frequency of the first oscillating signal.

* * * * *